United States Patent
Navarro Castillo et al.

(10) Patent No.: US 10,903,828 B2
(45) Date of Patent: Jan. 26, 2021

(54) VOLTAGE REGULATOR PHASE DUTY CYCLE CONTROL APPARATUS AND METHOD

(71) Applicant: Intel Corporation, Santa Clara, CA (US)

(72) Inventors: Karen Navarro Castillo, Tlaquepaque (MX); Scott M. Rider, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 757 days.

(21) Appl. No.: 15/488,343

(22) Filed: Apr. 14, 2017

(65) Prior Publication Data

US 2018/0302077 A1 Oct. 18, 2018

(51) Int. Cl.
*H03K 7/08* (2006.01)
*G06F 1/26* (2006.01)
*H02M 1/00* (2006.01)
*H02M 3/158* (2006.01)

(52) U.S. Cl.
CPC .............. *H03K 7/08* (2013.01); *G06F 1/26* (2013.01); *H02M 3/1584* (2013.01); *H02M 2001/008* (2013.01)

(58) Field of Classification Search
CPC ............................ H03K 7/08; H02M 2001/008
See application file for complete search history.

(56) References Cited

U.S. PATENT DOCUMENTS

| | | | | |
|---|---|---|---|---|
| 5,861,684 A * | 1/1999 | Slade | ............... | H02J 1/06 |
| | | | | 307/150 |
| 8,417,980 B1 * | 4/2013 | Mimberg | ............ | G06F 1/26 |
| | | | | 713/330 |
| 9,843,252 B1 * | 12/2017 | Chang | ............ | H02M 3/1584 |
| 9,857,854 B2 * | 1/2018 | Zhang | ............ | G06F 1/26 |
| 9,921,629 B2 * | 3/2018 | Berke | ............ | G06F 1/26 |
| 10,325,631 B1 * | 6/2019 | Rowley | ............ | G06F 1/263 |
| 10,651,734 B2 * | 5/2020 | Zhu | ............ | G01K 3/005 |
| 2005/0102539 A1 * | 5/2005 | Hepner | ............ | G06F 1/324 |
| | | | | 713/300 |
| 2009/0249092 A1 * | 10/2009 | Lam | ............ | G06F 1/266 |
| | | | | 713/310 |
| 2009/0267578 A1 * | 10/2009 | Luo | ............ | H02J 1/102 |
| | | | | 323/272 |

(Continued)

*Primary Examiner* — Yusef A Ahmed
(74) *Attorney, Agent, or Firm* — Schwabe, Williamson & Wyatt, P.C.

(57) ABSTRACT

Embodiments herein relate to multi-phase voltage regulator power phase duty cycle control in computer add-in cards. A computer add-in card may include a card body, a first power connector disposed on the card body, a second power connector, one or more multi-phase voltage regulators coupled with one or more of the first power connector and the second power connector, and a processor coupled with the one or more multi-phase voltage regulators, where the processor is to generate one or more power control signals and one or more of the one or more multi-phase voltage regulators is to adjust a duty cycle of one or more power phases in response to the one or more power control signals. In some embodiments, the power control signals may be serial voltage identification signals or may be provided over an inter-integrated circuit bus. Other embodiments may be described and/or claimed.

16 Claims, 5 Drawing Sheets

(56) References Cited

U.S. PATENT DOCUMENTS

| | | | |
|---|---|---|---|
| 2010/0102790 A1* | 4/2010 | Buterbaugh | H02M 3/285 323/283 |
| 2011/0012426 A1* | 1/2011 | Huang | H02J 1/00 307/11 |
| 2011/0080151 A1* | 4/2011 | Rahardjo | G05B 15/02 323/285 |
| 2011/0221405 A1* | 9/2011 | Tang | H02M 3/156 323/234 |
| 2011/0234000 A1* | 9/2011 | Yan | H02J 1/08 307/31 |
| 2011/0302440 A1* | 12/2011 | DiMarco | G06F 1/26 713/340 |
| 2014/0232420 A1* | 8/2014 | Luo | H02M 3/1584 324/750.01 |
| 2014/0312868 A1* | 10/2014 | Dally | H02M 3/1588 323/282 |
| 2015/0002112 A1* | 1/2015 | Tang | H02H 7/1213 323/271 |
| 2015/0067376 A1* | 3/2015 | Cueva Gonzalez | G06F 1/30 713/340 |
| 2015/0280563 A1* | 10/2015 | Tang | H02M 3/1584 323/271 |
| 2016/0033611 A1* | 2/2016 | Rahardjo | G01R 35/005 702/104 |
| 2016/0116549 A1* | 4/2016 | Mathew | G05F 1/10 702/60 |
| 2016/0231802 A1* | 8/2016 | Jenne | G06F 1/3243 |
| 2017/0054368 A1* | 2/2017 | Tschirhart | G06F 1/26 |
| 2017/0060213 A1* | 3/2017 | Wu | G06F 1/26 |
| 2017/0063239 A1* | 3/2017 | Wu | G06F 1/26 |
| 2017/0147050 A1* | 5/2017 | Berke | G06F 1/26 |
| 2017/0300398 A1* | 10/2017 | Luo | G06F 1/26 |
| 2018/0034374 A1* | 2/2018 | Breen | H02M 3/158 |
| 2018/0107258 A1* | 4/2018 | Remis | G06F 8/65 |
| 2018/0107470 A1* | 4/2018 | Remis | G06F 1/26 |
| 2018/0107476 A1* | 4/2018 | Remis | G06F 11/3442 |
| 2018/0224911 A1* | 8/2018 | Hung | G06F 1/266 |
| 2018/0269786 A1* | 9/2018 | Mirjafari | H02M 3/1584 |
| 2018/0294720 A1* | 10/2018 | Zhu | H02M 3/158 |
| 2018/0301120 A1* | 10/2018 | Thaploo | G06F 3/14 |
| 2018/0364784 A1* | 12/2018 | Luo | G06F 13/4072 |
| 2020/0133380 A1* | 4/2020 | Jenne | G06F 1/3253 |

* cited by examiner

VOLTAGE REGULATOR PHASE DUTY CYCLE CONTROL APPARATUS AND METHOD

FIELD

Embodiments of the present disclosure generally relate to the fields of computer and electronic circuits, and, more particularly, to voltage regulator phase duty cycle control apparatus and methods.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Add-in cards for computer systems such as computer add-in cards compliant with the Peripheral Component Interconnect Express (PCIe) specification may include more than one power connector. In legacy computer systems, power from the power connectors is typically regulated by statically setting multi-phase voltage regulators coupled with the power connectors. These static settings may not optimize power delivery for varying load conditions that may occur in switching between computation intensive, memory intensive, or input/output (I/O) intensive applications.

BRIEF DESCRIPTION OF THE DRAWINGS

Embodiments of the dynamic voltage regulator phase duty cycle control apparatus and/or method may overcome these limitations. The embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
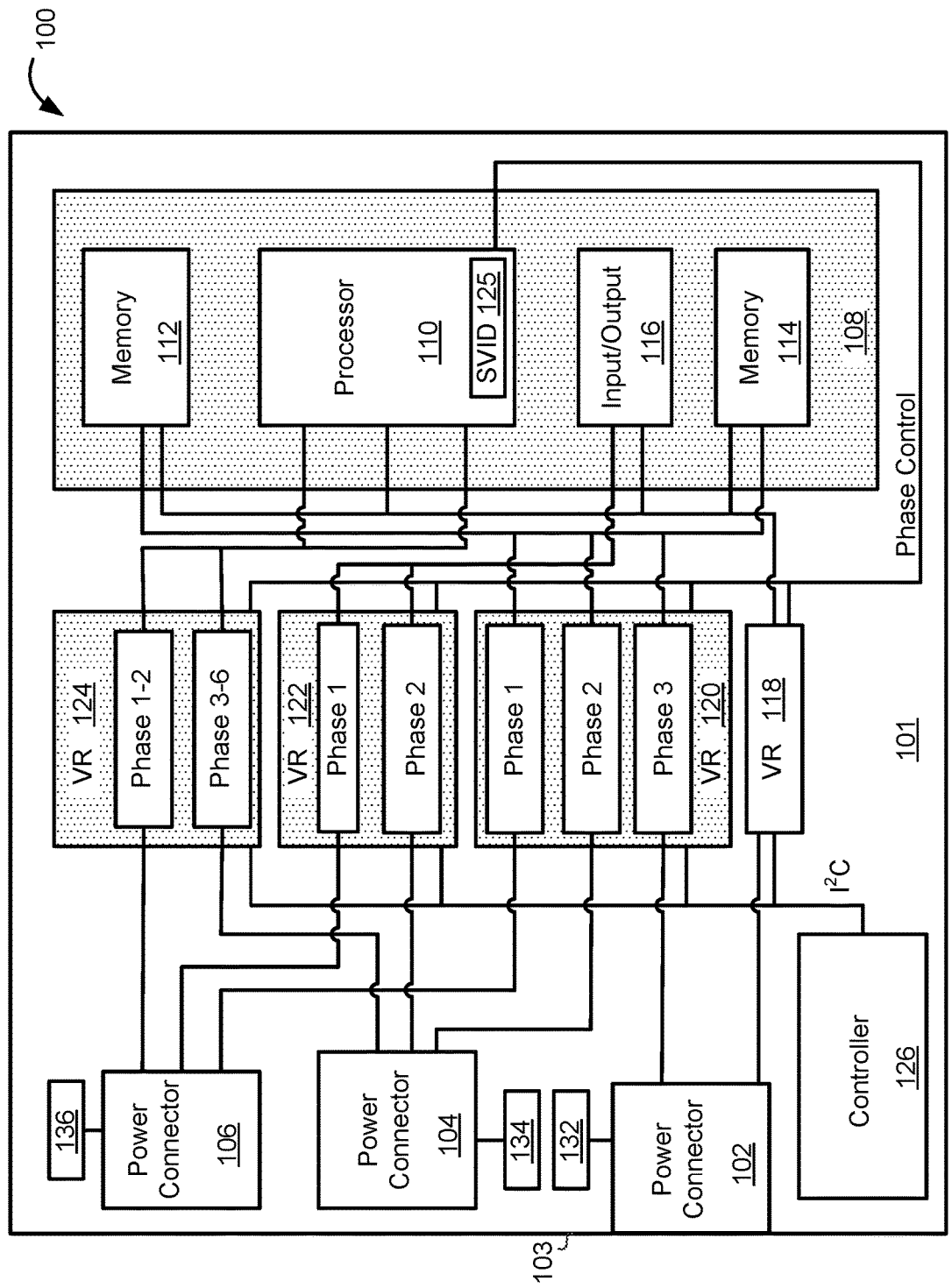
FIG. 1 illustrates a schematic view of a computer add-in card having dynamic voltage regulator phase duty cycle control, according to various embodiments.

Embodiments of the present disclosure describe multi-phase voltage regulator power phase duty cycle control in computer add-in cards. In various embodiments, a computer add-in card may include a card body, a first power connector disposed on the card body, a second power connector disposed on the card body, one or more multi-phase voltage regulators disposed on the card body, and coupled with one or more of the first power connector and the second power connector, and a processor coupled with the one or more multi-phase voltage regulators, where during operation, the processor is to generate one or more power control signals and one or more of the one or more multi-phase voltage regulators is to adjust a duty cycle of one or more power phases in response to the one or more power control signals. In some embodiments, the processor may direct the voltage regulators to dynamically adjust the duty cycle power phases to balance power across the power connectors of the computer add-in card to allow a maximum power to be consumed without violating an electrical specification specifying a maximum power draw for each connector. In various embodiments, this may allow dynamic power draw optimization to account for the differing power loads resulting from different types of applications running on the computer add-in card (e.g., I/O intensive, processor intensive, and/or memory read/write intensive applications).

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

FIG. 1 illustrates a schematic view of a computer add-in card 100 having dynamic voltage regulator phase duty cycle control, according to various embodiments. In some embodiments, the add-in card 100 may be a PCIe card for coupling with a PCIe bus of a computer system. The computer add-in card 100 may be another type of card in other embodiments, coupling to other interfaces of computer systems. In various embodiments, the add-in card 100 may include a card body 101 configured to mate with an interface of a computer system. In some embodiments, the computer add-in card 100 may include a first power connector 102, a second power connector 104, and a third power connector 106 to receive power for regulation and distribution to one or more components on the computer add-in card 100.

In various embodiments, the first power connector 102 may be disposed on the card body 101 at a card edge 103. In some embodiments, the card edge 103 may be structured for insertion and coupling with a receptacle on a motherboard of a host computer system and may include data connectors, not shown for clarity, in addition to one or more power connectors. In various embodiments, the first power connector 102 may receive power from the motherboard when the card edge 103 is inserted into the receptacle and the host computer system is powered on. In some embodiments, the first power connector 102 may be a PCIe connector that may have a 75 Watt (W) power limit. In some embodiments, the second power connector 104 may be a 2×4 connector that may have a 150 W power limit, and/or the third power connector 106 may be a 2×3 power connector that may have a 75 W power limit. In various embodiments, different types of connectors, numbers of connectors, and/or power limits for the connectors may be used.

In some embodiments, the computer add-in card 100 may include an integrated circuit (IC) package 108 that may include a processor 110 (e.g., a central processing unit (CPU), a graphics processing unit (GPU), a field programmable gate array (FPGA), an application specific integrated circuit (ASIC), a microcontroller, or some other type of processor), a first on-package memory 112, a second on-package memory 114, and processor input/output (I/O) circuitry 116. In embodiments, the computer add-in card 100 may include additional IC packages or other electronic components. In various embodiments, the computer add-in card 100 may include a first voltage regulator (VR) 118, a second VR 120, a third VR 122, and a fourth VR 124 to regulate power from one or more of the first power connector 102, the second power connector 104, and the third power connector 106 for distribution to one or more components on the computer add-in card 100 (e.g., processor 110, the first on-package memory 112, the second on-package memory 114, and/or the processor I/O circuitry 116.) In various embodiments, one or more of the VRs may be multi-phase VRs. In some embodiments, one or more of the VRs may not be a multi-phase VR (e.g., first VR 118).

In some embodiments, the first VR 118 may regulate power from the first power connector 102 at a first voltage level (e.g., 3.3 V) with a first maximum power output (e.g., 10 W). In various embodiments, the second VR 120, the third VR 122, and the fourth VR may regulate power at a second voltage level (e.g., 12 V). In some embodiments, the first power connector 102 may have a first maximum power output level of 10 W for the 3.3 V power regulated by the first VR 118 and a second maximum power output level of 65 W for the 12 V power regulated by the second VR 120 for a total maximum power output level of 75 W. In some embodiments, the second maximum power output level of the first power connector 102 may be used in determinations of whether phase duty cycles are to be adjusted rather than using the total maximum power output level of the first power connector 102.

In some embodiments, the second VR 120 may regulate power from the third power connector 106 on a first phase, from the second power connector 104 on a second phase, and from the first power connector 102 on a third phase. In various embodiments, the power from the second VR 120 may be distributed to the first on-package memory 112 and/or the second on-package memory 114. In some embodiments, the third VR 122 may regulate power from the third power connector 106 on a first phase and from the second power connector 104 on a second phase. In various embodiments, the power from the third VR 122 may be distributed to the processor I/O circuitry 116. In some embodiments, the fourth VR 124 may regulate power from the third power connector 106 on a first phase and a second phase and from the second power connector 104 on third through sixth phases. In various embodiments, power from the fourth VR 124 may be distributed to the processor 110 for use by one or more processor cores of the processor 110. In some embodiments, the specific connections between the VRs and the power connectors, the power phase relationships, and/or the power distribution to the components may differ.

In some embodiments, the processor 110 may include a serial voltage identification (SVID) controller 125 and may direct one or more of the VRs 118, 120, 122, 124 to adjust a duty cycle of one or more power phases with an SVID phase control signal. In various embodiments, the computer add-in card 100 may include a baseboard management controller (BMC) 126 that may direct one or more of the VRs 118, 120, 122, 124 to adjust a duty cycle of one or more power phases with a control signal that may be over an inter-integrated circuit (I$^2$C) bus. In some embodiments, the SVID controller 125 of the processor 110 and/or the BMC 126 may generate the phase control signal based at least in part on one or more power measurements read from one or more of the VRs 118, 120, 122, and/or 124. In embodiments, a BMC external to the computer add-in card 100 may communicate with one or more of the VRs 118, 120, 122, and/or 124 instead of or in addition to the BMC 126 in a similar fashion to that described with respect to the BMC 126.

In various embodiments, the computer add-in card 100 may include an optional first power sensor 132 to measure a power level delivered by the first power connector 102, an optional second power sensor 134 to measure a power level delivered by the second power connector 104, and/or an optional third power sensor 136 to measure a power level delivered by the third power connector 106. In some embodiments, the power sensors 132, 134, and/or 136 may be coupled with the BMC 126 and/or the SVID controller 125 of the processor 110, connections not shown for clarity. The power sensors 132, 134, 136 may provide an alternate way of determining the power level for some embodiments. In some embodiments where the power sensors 132, 134, and/or 136 are present, the SVID controller 125 of the processor 110 and/or the BMC 126 may generate the phase control signal based at least in part on one or more power measurements read by the power sensor 132, 134, and/or 136 instead or in addition to reading one or more power levels from one or more of the VRs 118, 120, 122, and/or 124. In some embodiments, one or more of the power sensors 132, 134, 136 or the VRs 118, 120, 122, 124 may measure and/or provide another type of measurement such as a current measurement instead of or in addition to a power level measurement. In such embodiments, the SVID controller 125 of the processor 110 and/or the BMC 126 may determine one or more power levels based at least in part on the other type of measurement (e.g., one or more current measurements). In some embodiments, the power sensors 132, 134, 136 or the VRs 118, 120, 122, 124 may determine whether a power level of one or more of the power connectors 102, 104, 106 exceeds a predetermined threshold. Except for the voltage regulator phase duty cycle control technology of the present disclosure, add-on card 100 may otherwise be any one of a number of add-on cards known in the art.

Figure 2:
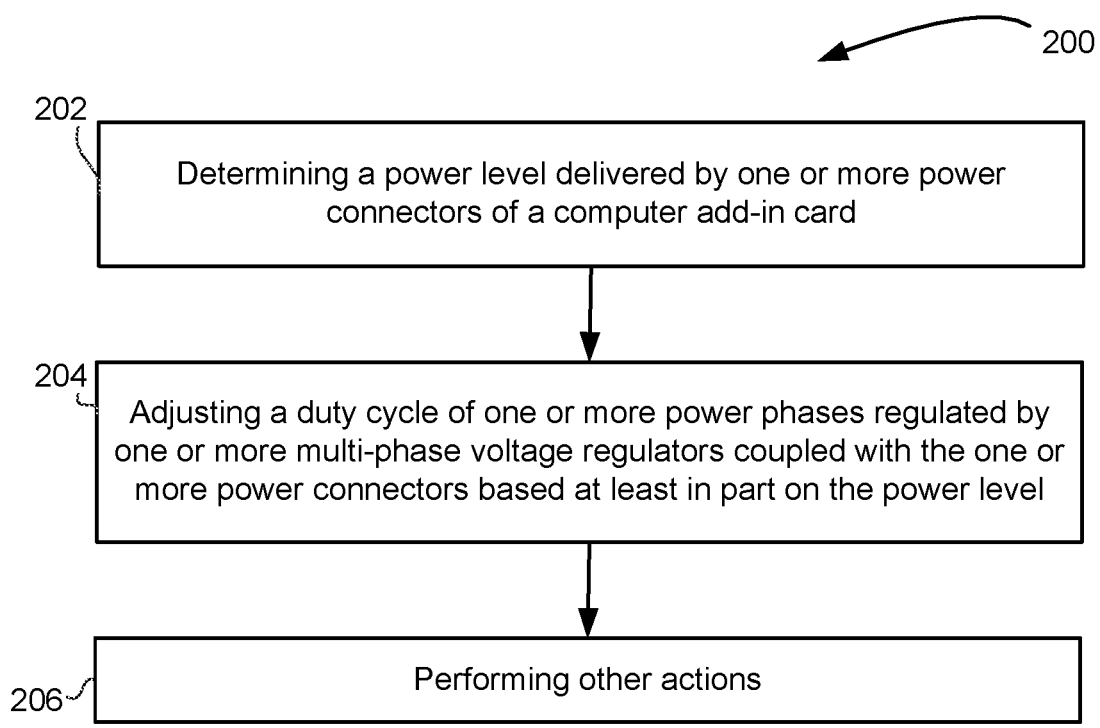
FIG. 2 is a flow diagram illustrating a method of adjusting a duty cycle of one or more power phases regulated by one or more multi-phase voltage regulators of a computer add-in card, according to various embodiments.

FIG. 2 is a flow diagram illustrating a method 200 of adjusting a duty cycle of one or more power phases regulated by one or more multi-phase voltage regulators of a computer add-in card, according to various embodiments. In embodiments, some or all of the method 200 may be practiced by components of the computer add-in card 100 described with respect to FIG. 1, e.g., controller 126, and VR 120-124. In various embodiments, at a block 202, the method 200 may include determining or causing to determine a power level delivered by one or more power connectors (e.g., power connectors 102, 104, and/or 106) of a computer add-in card. In some embodiments, determining the power level may include reading information from one or more multi-phase voltage regulators (e.g., VRs 118, 120, 122, and/or 124) and determining the power level based at least in part on the information read. In some embodiments, determining the power level may include reading a power level as measured by a power sensor (e.g., power sensor 132, 134, and/or 136). In embodiments, determining the power level may include calculating the power level based at least in part on a measured current level.

In some embodiments, at a block 204, the method 200 may include adjusting or causing to adjust a duty cycle of one or more power phases regulated by one or more multi-phase voltage regulators (e.g., VRs 118, 120, 122, and/or 124) coupled with the one or more power connectors based at least in part on the determined power level. In various embodiments, adjusting a duty cycle of one or more power phases may include determining a phase adjustment level based at least in part on the power level, generating one or more power control signals based at least in part on the phase adjustment level, and adjusting the duty cycle of one or more power phases in response to the one or more power control signals. In some embodiments, determining the phase adjustment level may include determining a difference between the power level and a predefined power limit, where the phase adjustment level is based at least in part on the difference between the power level and the predefined power limit. In various embodiments, the one or more power control signals may be SVID signals. In some embodiments, the method 200 may include providing the one or more power control signals to one or more of the one or more multi-phase voltage regulators over an I²C bus. At a block 206, the method 200 may include performing other actions. In various embodiments, the method 200 may return to the block 202 to provide for dynamic phase duty cycle adjustment.

Figure 3:
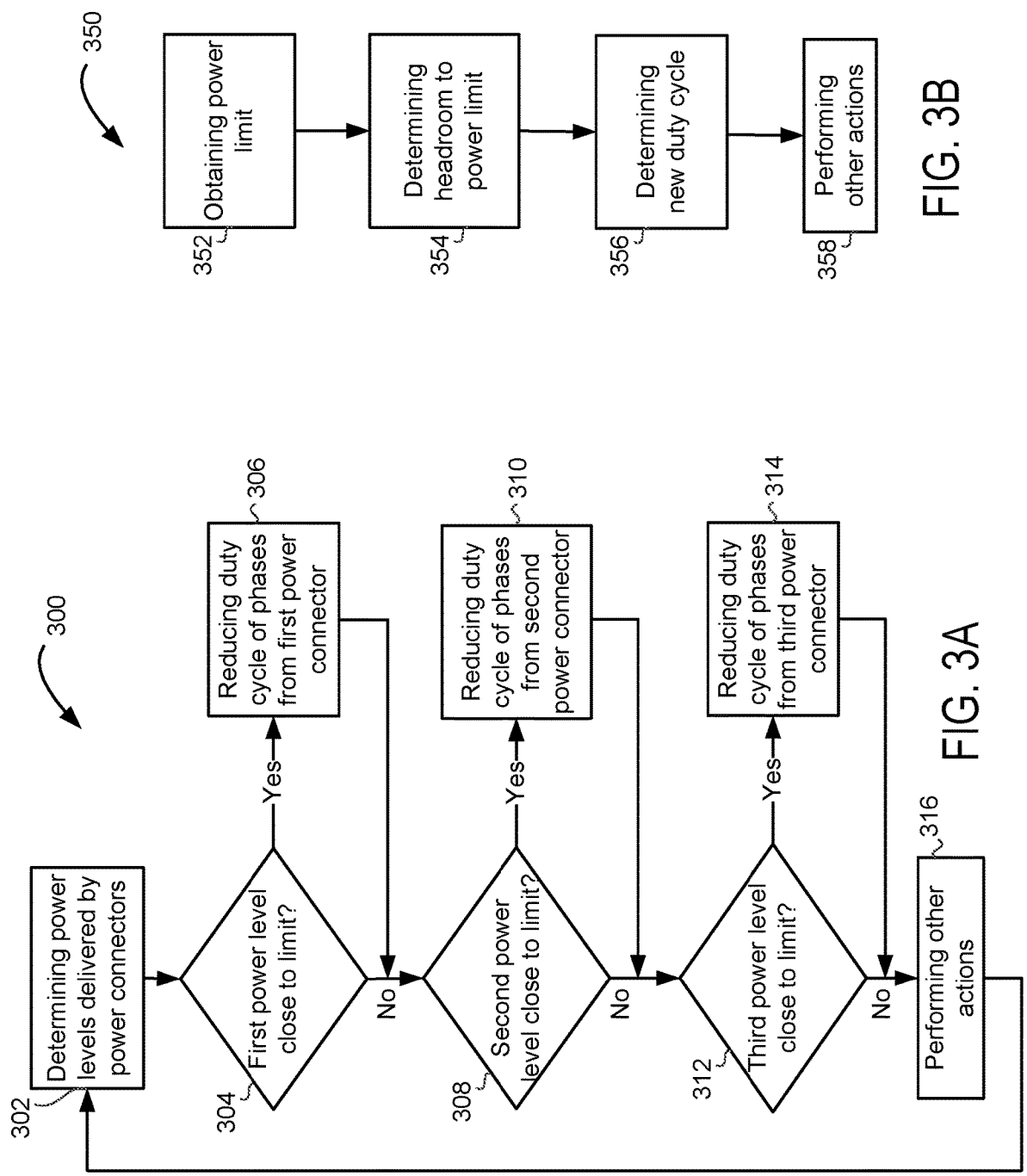
FIGS. 3A and 3B are flow diagrams illustrating a method 300 of adjusting a duty cycle of one or more power phases regulated by one or more multi-phase voltage regulators of a computer add-in card, according to various embodiments.

FIGS. 3A and 3B are flow diagrams illustrating a method 300 of adjusting a duty cycle of one or more power phases regulated by one or more multi-phase voltage regulators (e.g., VRs 118, 120, 122, and/or 124) of a computer add-in card, according to various embodiments. In some embodiments, the method 300 may be a more specific implementation of the method 200 described with respect to FIG. 2. In embodiments, some or all of the method 300 may be practiced by components of the computer add-in card 100 described with respect to FIG. 1 (e.g., controller 126, and VR 120-124). In various embodiments, at a block 302, the method 300 may include determining or causing to determine one or more power levels delivered by one or more power connectors (e.g., power connector 102, 104, and/or 106). In some embodiments, determining the one or more power levels may include measuring one or more input currents of the power connectors and/or calculating a power level based at least in part on the input currents. In some embodiments, determining the one or more power levels may include sensing one or more power levels with one or more individual power sensors (e.g., power sensor 132, 134, and/or 136). In some embodiments, determining the one or more power levels may include reading one or more power levels from one or more VRs (e.g., controller 126 and/or processor 110 reading one or more power levels from VRs 118, 120, 122, and/or 124). In various embodiments, reading one or more power levels from the VRs may include reading one or more power levels for the entire VR or reading one or more power levels from the VR on a per-phase basis. In some embodiments, determining the power level of an individual connector may include determining the power level based at least in part on power levels read from more than one VR (e.g., power levels for phases 1-2 of VR 124; power level of phase 1 for VR 122; and power level for phase one of VR 120 to determine the power level for the third power connector 106).

In some embodiments, at a block 304, the method 300 may include determining whether a first power level is close to a first power limit (e.g., power level of the third power connector 106 close to a 2×3 connector 75 W power limit). In various embodiments, determining whether the first power level is close to a first power limit may include determining whether the first power level is within a control region. In some embodiments, the control region may be defined as a power level of 80% or more of the power limit (e.g., at or above 60 W for a 2×3 connector with a 75 W power limit). The control region may be determined and/or defined in another manner in other embodiments. If, at the block 304, it is determined the first power level is close to the first power limit (e.g., within the control region), the method 300 may include reducing a duty cycle of phases from the first power connector at a block 306. In some embodiments, reducing a duty cycle at the block 306 may include performing one or more actions described with respect to a method 350 of reducing a duty cycle shown in FIG. 3B.

In some embodiments, at a block 352, the method 350 may include obtaining a power limit for a power connector (e.g., a power limit for the power connector 102, 104, or 106). In various embodiments, obtaining the power limit may include looking up the power limit in a stored location. In some embodiments, at a block 354, the method 350 may include determining an amount of headroom to the power limit. In various embodiments, determining the amount of headroom to the power limit may include calculating the headroom by subtracting the measured power level from a maximum allowed power for the connector (e.g., for a measured power level of 65 W and a maximum allowed power of 75 W, the headroom calculation may be 75 W−65 W=10 W). In some embodiments, at a block 356, the method 350 may include determining a new duty cycle. In various embodiments, determining the new duty cycle may include determining the new duty cycle based at least in part on the headroom. In some embodiments, determining the new duty cycle may include calculating a duty cycle adjustment parameter. In various embodiments, calculating the duty cycle adjustment parameter may be based at least in part on one or more of the power limit for the connector, the current measured power, and/or the threshold for the control region. In some embodiments, the duty cycle adjustment parameter may be calculated with a formula of: duty cycle adjustment parameter=(measured power−control region threshold)/(power limit−control region threshold). Continuing with the example presented above, a 2×3 connector having a maximum power limit of 75 W, a control region threshold of 60 W, and a measured power level of 65 W may result in a duty cycle adjustment parameter of (65 W−60 W)/(75 W−60 W)=⅓, or approximately 0.33.

In some embodiments, the duty cycle may be adjusted based at least in part on the duty cycle adjustment parameter. In various embodiments, the duty cycle may be adjusted by multiplying a maximum allowable adjustment by the duty cycle adjustment parameter and subtracting the result from the unadjusted original duty cycle (e.g., characterized as 100% when at original unadjusted value). In some embodiments, the maximum allowable adjustment may be 20%, which would result in a new duty cycle for the above described example of 100%−(20%*0.33)=93.4%. In various embodiments, these duty cycles may not be absolute duty cycles corresponding to a percentage on duration, but may be relative duty cycles corresponding to the unadjusted duty cycle of the phase, which is deemed to be 100% regardless of its percentage on duration. In some embodiments, this may result in the same duty cycle percentage number corresponding to different percentages on durations when applied to different voltage regulators that may each have a different number of power phases (e.g., a 2 phase VR may have higher unadjusted percentage on durations for each phase in comparison to a 6 phase VR). In some embodiments, the maximum allowable adjustment may be a value other than 20%. In various embodiments, at a block 358, the method 350 may include performing other actions (e.g., sending a control signal indicating the new duty cycle to a VR).

In some embodiments, one or more other phases may be adjusted by the VR in addition to the phase for which a phase adjustment signal is sent. In various embodiments, the VR may automatically increase the duty cycle of one or more other phases when the duty cycle of another phase regulated by the VR is reduced in response to the phase control signal. For example, in some embodiments, the second VR 122 may have unadjusted duty cycles of 50% percentage on for each of phase 1 and phase 2. As discussed above, these would each be deemed to be at 100% for purposes of phase adjustment. If the second power connector 104 approaches its power limit, the processor 110 and/or the BMC 126 may send a phase control signal to the second VR 122 to reduce the duty cycle of phase 2 (e.g., from 100% to 80%). This may result in phase 2 from the second VR 122 having a 40% percentage on duration. In response, the second VR 122 may also increase the duty cycle of phase 1 (e.g., from 100% to 120% with a corresponding 60% percentage on duration) to shift power draw from the second power connector 104 to the third power connector 106 and maintain distribution of power to the I/O 116.

In various embodiments, at a block 308, the method 300 may include determining whether a second power level is close to a second power limit (e.g., power level of the second power connector 104 close to a 2×4 connector 150 W power limit) if the first power level was not determined to be close to the first power limit or after the duty cycle of phases from the first power connector was reduced at the block 306. In various embodiments, determining whether the second power level is close to a second power limit may include determining whether the second power level is within a control region. In some embodiments, the control region may be defined as a power level of 80% or more of the power limit (e.g., at or above 120 W for a 2×4 connector with a 150 W power limit). The control region may be determined and/or defined in another manner in other embodiments. If, at the block 308, it is determined the second power level is close to the second power limit (e.g., within the control region), the method 300 may include reducing a duty cycle of phases from the second power connector at a block 310. In some embodiments, reducing a duty cycle at the block 310 may include performing one or more actions described with respect to the method 350 of reducing a duty cycle shown in FIG. 3B.

In various embodiments, at a block 312, the method 300 may include determining whether a third power level is close to a third power limit (e.g., power level of the first power connector 102 close to a PCIe connector 75 W power limit) if the second power level was not determined to be close to the second power limit or after the duty cycle of phases from the second power connector was reduced at the block 310. In various embodiments, determining whether the third power level is close to a third power limit may include determining whether the third power level is within a control region. In some embodiments, the control region may be defined as a power level of 80% or more of the power limit (e.g., at or above 60 W for a PCIe connector with a 75 W power limit). The control region may be determined and/or defined in another manner in other embodiments. In some embodiments, the 10 W power limit for the 3.3V regulated voltage from the first power connector 102 may not be included in determining whether the power level is close to the third power limit such that only the 65 W power limit for the 12V regulated voltage from the first power connector is considered and only the power phase relating to the 12V voltage is adjusted if needed (e.g., phase 3 of VR 120). If, at the block 312, it is determined the third power level is close to the third power limit (e.g., within the control region), the method 300 may include reducing a duty cycle of phases from the third power connector at a block 314. In some embodiments, reducing a duty cycle at the block 314 may include performing one or more actions described with respect to the method 350 of reducing a duty cycle shown in FIG. 3B.

In some embodiments, at a block 316, the method 300 may include performing other actions. In various embodiments, the method 300 may return to the block 302 where power levels delivered by the power connectors may be determined. In some embodiments, returning to the block 302 may provide for dynamic voltage regulator phase duty cycle control such that the computer add-in card 100 may dynamically respond to varying power demands that may result from different types of applications running on the computer add-in card 100, such as the differing power demands of I/O intensive applications, processor intensive applications, and memory read/write intensive applications. In embodiments, this may allow the computer add-in card 100 to dynamically adjust the duty cycle of one or more power phases to balance power across the PCIe power connectors (e.g., power connectors 102, 104, 106) so that maximum power may be consumed without violating the PCIe electrical specification.

Figure 4:
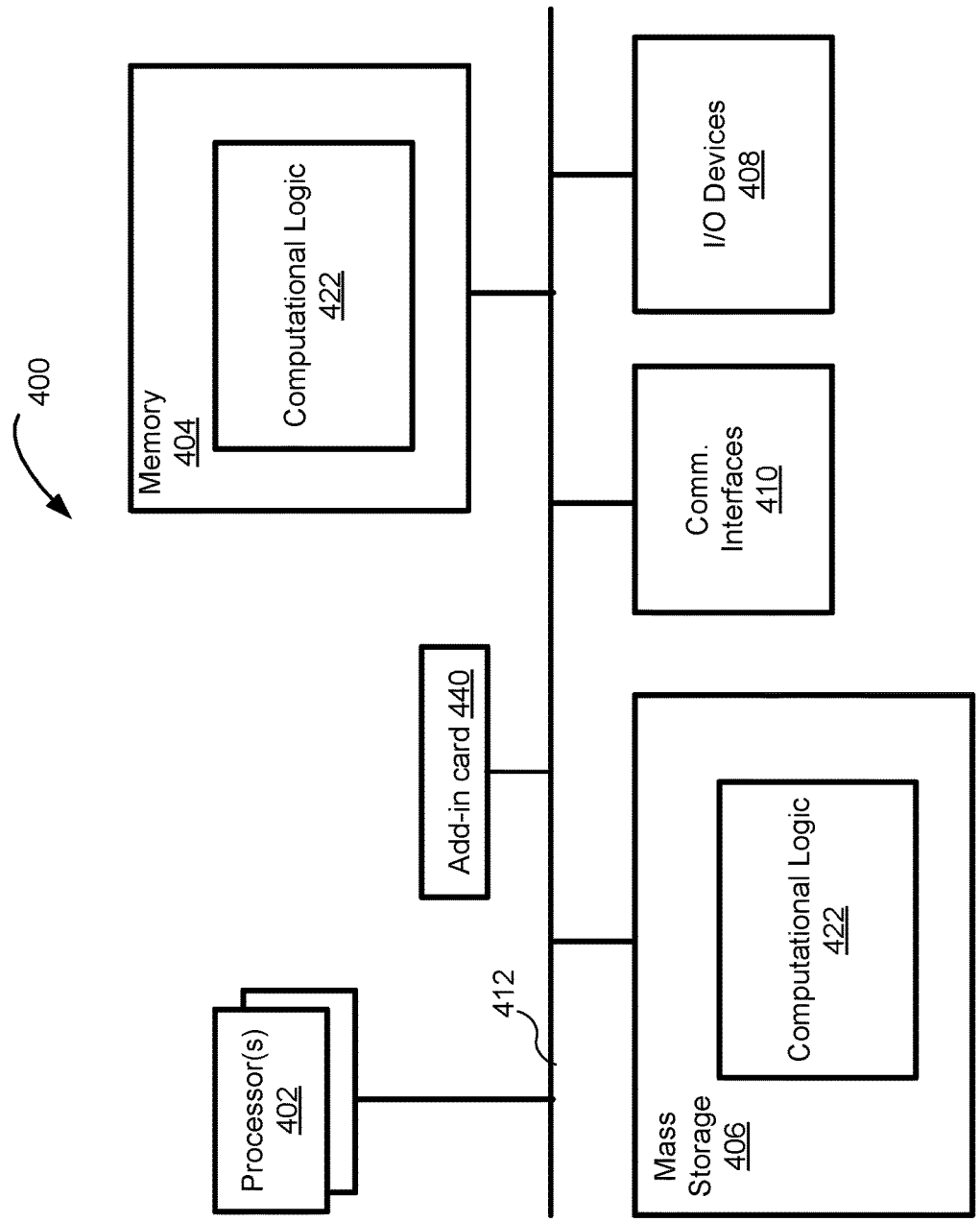
FIG. 4 schematically illustrates an example computing device including a computer add-in card, according to various embodiments.

FIG. 4 illustrates an example computing device 400 that may include various components of FIG. 1, such as computer add-in card 100, in accordance with various embodiments. As shown, computing device 400 may include one or more processors or processor cores 402 and system memory 404. For the purpose of this application, including the claims, the terms "processor" and "processor cores" may be considered synonymous, unless the context clearly requires otherwise. The processor 402 may include any type of processors, such as a central processing unit (CPU), a microprocessor, and the like. The processor 402 may be implemented as an integrated circuit having multi-cores, e.g., a multi-core microprocessor. The computing device 400 may include mass storage devices 406 (such as diskette, hard drive, volatile memory (e.g., dynamic random-access memory (DRAM), compact disc read-only memory (CD-ROM), digital versatile disk (DVD), and so forth), coupled with processor(s) 402 and memory 404 via one or more buses 412. In general, system memory 404 and/or mass storage devices 406 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth. One or more buses 412 may include one or more PCIe buses, $I^2C$ bus, and so forth. When more than one bus is employed, the buses may be bridged, e.g., PCI bridges.

The computing device 400 may further include input/output devices 408 (such as a display (e.g., a touchscreen display), keyboard, cursor control, remote control, gaming controller, image capture device, and so forth) and communication interfaces 410 (such as network interface cards, modems, infrared receivers, radio receivers (e.g., Bluetooth), PCIe interfaces, and so forth). The computing device 400 may include an add-in card 440 (e.g., computer add-in card 100) that may include one or more power connectors (e.g., power connectors 102, 104, 106) regulated by one or more multi-phase VRs (e.g., VRs 120, 122, 124). In various embodiments, I/O devices 408, communication interfaces 410, and the add-in card 440 may be coupled with other components of the computing device 400 through the one or more buses 412.

The communication interfaces 410 may include communication chips (not shown) that may be configured to operate the device 400 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 410 may operate in accordance with other wireless protocols in other embodiments. In some embodiments, the communication interfaces 410 may operate in accordance with one or more wired network protocols or technologies such as Ethernet (e.g., Institute of Electrical and Electronics Engineers (IEEE) standard 802.3) or some other wired network protocol or technology.

In embodiments, memory 404 and mass storage 406 may include non-persistent and persistent copies of programming instructions configured to implement an operating system (OS) and one or more applications, which may be any OS and applications known in the art, collectively referred to as computing logic 422. Computing logic 422 may be implemented by assembler instructions supported by processor(s) 402 or high-level languages that may be compiled into such instructions.

The permanent copy of the programming instructions may be placed into mass storage devices 406 in the factory or in the field through, for example, a distribution medium (not shown), such as a compact disc (CD), or through communication interface 410 (from a distribution server (not shown)). That is, one or more distribution media having an implementation of the agent program may be employed to distribute the agent and to program various computing devices.

The number, capability, and/or capacity of the elements 402, 404, 406, 408, 410, 412, and 440 may vary, depending on whether computing device 400 is used as a stationary computing device, such as a set-top box or desktop computer, or a mobile computing device, such as a tablet computing device, laptop computer, game console, smartphone, navigation and/or infotainment system. Their constitutions are otherwise known, and accordingly will not be further described.

For some embodiments, at least one of processors 402 may be packaged together with all or portions of computational logic 422 configured to facilitate aspects of embodiments described herein to form a System in Package (SiP) or a System on Chip (SoC).

Figure 5:
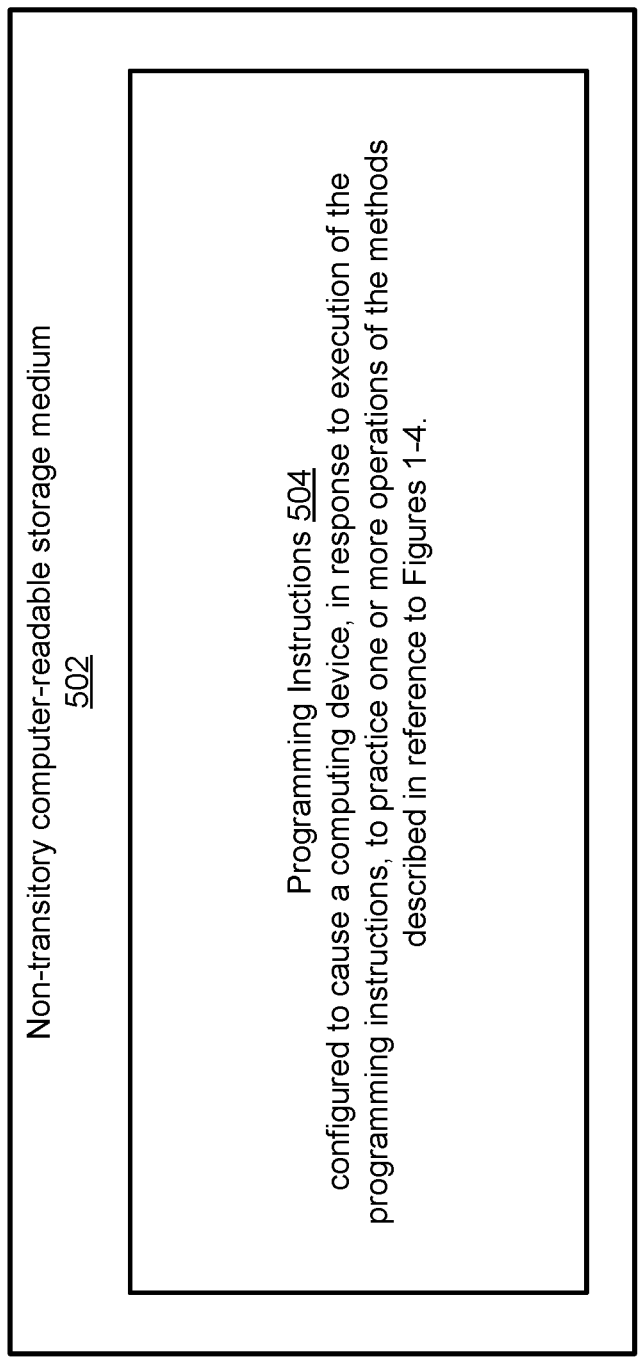
FIG. 5 illustrates an example storage medium with instructions configured to enable an apparatus to practice various aspects of the present disclosure, in accordance with various embodiments.

FIG. 5 illustrates example computer-readable storage medium 502 having instructions configured to practice all or selected ones of the operations associated with the computer add-in card 100, earlier described with respect to FIG. 1; the processor 110, the SVID controller 125 of the processor 110, the BMC 126, and/or the other components of FIG. 1; the method 200 of FIG. 2; the method 300 of FIG. 3A; and/or the method 350 of FIG. 3B, in accordance with various embodiments. As illustrated, computer-readable storage medium 502 may include a number of programming instructions 504. The storage medium 502 may represent a broad range of non-transitory persistent storage media known in the art, including but not limited to flash memory, dynamic random access memory, static random access memory, an optical disk, a magnetic disk, etc. Programming instructions 504 may be configured to enable a device, e.g., computer add-in card 100, in particular, BMC 126 in response to execution of the programming instructions 504, to perform, e.g., but not limited to, various operations described for the BMC 126 and/or other components of the computer add-in card 100 shown in FIG. 1, or operations shown in method 200 of FIG. 2, method 300 of FIG. 3A, or method 350 of FIG. 3B. In alternate embodiments, programming instructions 504 may be disposed on multiple computer-readable storage media 502. In an alternate embodiment, storage medium 502 may be transitory, e.g., signals encoded with programming instructions 504.

Referring back to FIG. 4, for an embodiment, the BMC of add-in card 440 may be packaged together with memory having all or portions of programming instructions 504 configured to practice aspects described for the BMC 126 and/or other components of the computer add-in card 100 shown in FIG. 1, operations shown in method 200 of FIG. 2, operations shown in method 300 of FIG. 3A, and/or operations shown in method 350 of FIG. 3B. For an embodiment, the BMC of add-in card 440 may be packaged together with memory having all or portions of programming instructions 504 configured to practice aspects described for the BMC 126 of the computer add-in card 100 shown in FIG. 1, operations shown in method 200 of FIG. 2, operations shown in method 300 of FIG. 3A, and/or operations shown in method 350 of FIG. 3B to form a System in Package (SiP). For an embodiment, the BMC of add-in card 440 may be integrated on the same die with memory having all or portions of some or all of programming instructions 504 configured to practice aspects described for the BMC 126 of the computer add-in card 100 shown in FIG. 1, operations shown in method 200 of FIG. 2, operations shown in method 300 of FIG. 3A, and/or operations shown in method 350 of FIG. 3B. For an embodiment, the BMC of add-in card 440 may be packaged together with memory having all or portions of programming instructions 504 configured to practice aspects of the BMC 126 and/or other components of the add-in card 100 shown in FIG. 1, operations shown in method 200 of FIG. 2, operations shown in method 300 of FIG. 3A, and/or operations shown in method 350 of FIG. 3B to form a System on Chip (SoC).

Machine-readable media (including non-transitory machine-readable media, such as machine-readable storage media), methods, systems and devices for performing the above-described techniques are illustrative examples of embodiments disclosed herein. Additionally, other devices in the above-described interactions may be configured to perform various disclosed techniques.

EXAMPLES

Example 1 may include a computer add-in card comprising: a card body; a first power connector disposed on the card body; a second power connector; one or more multi-phase voltage regulators coupled with one or more of the first power connector and the second power connector to deliver regulated power from the first power connector and the second power connector to one or more components disposed on the card body; and a processor coupled with the one or more multi-phase voltage regulators, wherein the processor is to generate one or more power control signals based at least in part on one or more power levels corresponding to a level of power delivered by one or more of the first power connector and the second power connector, wherein one or more of the one or more multi-phase voltage regulators is to adjust a duty cycle of one or more power phases in response to the one or more power control signals.

Example 2 may include the subject matter of Example 1, wherein the first power connector is to receive power from a host computer system at a card edge.

Example 3 may include the subject matter of any one of Examples 1-2, wherein the one or more multi-phase voltage regulators include a first multi-phase voltage regulator and a second multi-phase voltage regulator, wherein, in response to the one or more power control signals, the first multi-phase voltage regulator is to adjust a duty cycle of a first power phase to regulate power from the first power connector and adjust a duty cycle of a second power phase to regulate power from the second power connector, and the second multi-phase voltage regulator is to adjust a duty cycle of a third power phase to regulate power from the first power connector and adjust a duty cycle of a fourth power phase to regulate power from the second power connector.

Example 4 may include the subject matter of Example 3, further comprising a third power connector, wherein the one or more multi-phase voltage regulators further include a third multi-phase voltage regulator that, in response to the one or more power control signals, is to adjust a duty cycle of a fifth power phase to regulate power from the first power connector, adjust a duty cycle of a sixth power phase to regulate power from the second power connector, and adjust a duty cycle of a seventh power phase to regulate power from the third power connector.

Example 5 may include the subject matter of Example 4, wherein the first power connector is part of a peripheral component interconnect express (PCIe) connector at a card edge, the second connector is a 2×3 75 watt connector, and the third connector is a 2×4 150 watt connector.

Example 6 may include the subject matter of any one of Examples 1-5, further comprising: a first power sensor that is to measure a first power level delivered by the first power connector; and a second power sensor that is to measure a second power level delivered by the second power connector, wherein the processor is to generate the one or more power control signals based at least in part on one or more of the measured first power level or the measured second power level.

Example 7 may include the subject matter of any one of Examples 1-6, wherein the processor is a central processing unit and the one or more power control signals are to be provided to the one or more multi-phase voltage regulators with one or more serial voltage identification (SVID) signals.

Example 8 may include the subject matter of any one of Examples 1-6, wherein the processor is included in a baseboard management controller (BMC).

Example 9 may include the subject matter of any one of Examples 1-8, further comprising a memory, wherein the one or more multi-phase voltage regulators include a first multi-phase voltage regulator to provide power to the processor and a second multi-phase voltage regulator to provide power to the memory.

Example 10 may include a method comprising: determining a power level delivered by one or more power connectors of a computer add-in card; and adjusting a duty cycle of one or more power phases regulated by one or more multi-phase voltage regulators coupled with the one or more power connectors based at least in part on the power level.

Example 11 may include the subject matter of Example 10, wherein determining the power level includes reading information from more than one of the one or more multi-phase voltage regulators and determining the power level based at least in part on the information read.

Example 12 may include the subject matter of Example 10, wherein determining the power level includes reading a power level as measured by a power level sensor.

Example 13 may include the subject matter of any one of Examples 10-12, wherein determining the power level includes calculating the power level based at least in part on a measured current level.

Example 14 may include the subject matter of any one of Examples 10-13, wherein adjusting a duty cycle of one or more power phases includes determining a phase adjustment level based at least in part on the power level; generating one or more power control signals based at least in part on the phase adjustment level; and adjusting the duty cycle of one or more power phases in response to the one or more power control signals.

Example 15 may include the subject matter of Example 14, wherein determining the phase adjustment level includes determining a difference between the power level and a predefined power limit, wherein the phase adjustment level is based at least in part on the difference between the power level and the predefined power limit.

Example 16 may include the subject matter of any one of Examples 14-15, wherein the one or more power control signals are serial voltage identification (SVID) signals.

Example 17 may include the subject matter of any one of Examples 14-15, further comprising providing the one or more power control signals to one or more of the one or more multi-phase voltage regulators over an inter-integrated circuit ($I^2C$) bus.

Example 18 may include at least one computer-readable medium comprising instructions stored thereon that, in response to execution of the instructions by one or more processors of a device, cause the device to: determine a power level delivered by one or more power connectors of a computer add-in card; and direct one or more multi-phase voltage regulators to adjust a duty cycle of one or more power phases regulated by the one or more multi-phase voltage regulators coupled with the one or more power connectors based at least in part on the power level.

Example 19 may include the subject matter of Example 18, wherein the instructions are further to cause the device to read information from more than one of the one or more multi-phase voltage regulators and determine the power level delivered based at least in part on the information read.

Example 20 may include the subject matter of Example 18, wherein the instructions are further to cause the device to read a power level as measured by a power level sensor and determine the power level delivered based at least in part on the power level read.

Example 21 may include the subject matter of any one of Examples 18-20, wherein the instructions are to cause the device to determine the power level delivered by calculating the power level based at least in part on a measured current level.

Example 22 may include the subject matter of any one of Examples 18-21, wherein the instructions are further to cause the device to: determine a phase adjustment level based at least in part on the power level; and generate one or more power control signals based at least in part on the phase adjustment level.

Example 23 may include the subject matter of Example 22, wherein the instructions are to further cause the device to determine a difference between the power level and a predefined power limit, wherein the phase adjustment level is based at least in part on the difference between the power level and the predefined power limit.

Example 24 may include the subject matter of any one of Examples 22-23, wherein the one or more power control signals are serial voltage identification (SVID) signals.

Example 25 may include the subject matter of any one of Examples 22-23, wherein the instructions are to cause the device to provide the one or more power control signals to one or more of the one or more multi-phase voltage regulators over an inter-integrated circuit ($I^2C$) bus.

Example 26 may include a computer add-in card comprising: means for determining a power level delivered by one or more power connectors of the computer add-in card; and means for adjusting a duty cycle of one or more power phases regulated by one or more multi-phase voltage regulators coupled with the one or more power connectors based at least in part on the power level.

Example 27 may include the subject matter of Example 26, wherein the means for determining the power level includes means for reading information from more than one of the one or more multi-phase voltage regulators, wherein the means for determining the power level is to determine the power level based at least in part on the information read.

Example 28 may include the subject matter of Example 26, wherein the means for determining the power level includes means for reading a power level as measured by a power level sensor, wherein the means for determining the power level is to determine the power level based at least in part on the power level read.

Example 29 may include the subject matter of any one of Examples 26-28, wherein the means for determining the power level includes means for calculating the power level based at least in part on a measured current level.

Example 30 may include the subject matter of any one of Examples 26-29, wherein the means for adjusting the duty cycle includes means for determining a phase adjustment level based at least in part on the power level; and means for generating one or more power control signals based at least in part on the phase adjustment level, wherein the means for adjusting the duty cycle of the one or more power phases is to adjust the duty cycle in response to the one or more power control signals.

Example 31 may include the subject matter of Example 30, wherein the instructions are further to cause the device to determine a difference between the power level and a predefined power limit, wherein the phase adjustment level is based at least in part on the difference between the power level and the predefined power limit.

Example 32 may include the subject matter of any one of Examples 30-31, wherein the one or more power control signals are serial voltage identification (SVID) signals.

Example 33 may include the subject matter of any one of Examples 30-31, wherein the means for adjusting the duty cycle includes means for providing the one or more power control signals to one or more of the one or more multi-phase voltage regulators over an inter-integrated circuit ($I^2C$) bus.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the present specification, including what is described in the Abstract, is not intended to be exhaustive or to limit the specification to the precise forms disclosed. While specific implementations of, and examples for, the present specification are described herein for illustrative purposes, various equivalent modifications are possible within the scope of the specification, as those skilled in the relevant art will recognize.

These modifications may be made to the disclosed embodiments in light of the above detailed description. The terms used in the following claims should not be construed to limit the present specification to the specific implementations disclosed in the specification and the claims. Rather, the scope of the present specification is to be determined entirely by the following claims, which are to be construed in accordance with established doctrines of claim interpretation.

What is claimed is:

1. A computer add-in card comprising:
   a card body;
   a first power connector disposed on the card body;
   a second power connector;
   a first power sensor arranged to measure a first power level delivered by the first power connector;
   a second power sensor arranged to measure a second power level delivered by the second power connector;
   one or more multi-phase voltage regulators coupled with one or more of the first power connector and the second power connector to deliver power from at least one of the first power connector and the second power connector to one or more components disposed on the card body; and
   a processor coupled with the one or more multi-phase voltage regulators,
   wherein the processor is to generate one or more power control signals for the one or more multi-phase voltage regulators based at least in part on one or more of the first and second power levels of the power delivered by one or more of the first and second power connectors, and
   wherein one or more of the one or more multi-phase voltage regulators is to dynamically adjust a duty cycle of one or more power phases of the power delivered from one or more of the first and second power connectors, in response to the one or more power control signals, in order to balance power across the first and second power connectors to allow an amount of power to be consumed by the one or more components disposed on the card body without violating respective electrical specifications for power drawn for the first and second power connectors.

2. The computer add-in card of claim 1, wherein the first power connector is to receive power from a host computer system at a card edge.

3. The computer add-in card of claim 1, wherein the one or more multi-phase voltage regulators include a first multi-phase voltage regulator and a second multi-phase voltage regulator, wherein, in response to the one or more power control signals, the first multi-phase voltage regulator is to adjust a duty cycle of a first power phase of the power delivered from the first power connector, and adjust a duty cycle of a second power phase of the power delivered from the second power connector, and wherein, in response to the one or more power control signals, the second multi-phase voltage regulator is to adjust a duty cycle of a third power phase of the power delivered from the first power connector, and adjust a duty cycle of a fourth power phase of the power delivered from the second power connector.

4. The computer add-in card of claim 3, further comprising a third power connector, wherein the one or more multi-phase voltage regulators further include a third multi-phase voltage regulator that, in response to the one or more power control signals, is to adjust a duty cycle of a fifth power phase of the power delivered from the first power connector, adjust a duty cycle of a sixth power phase of the power delivered from the second power connector, and adjust a duty cycle of a seventh power phase of the power delivered from the third power connector.

5. The computer add-in card of claim 4, wherein the first power connector is part of a peripheral component interconnect express (PCIe) connector at a card edge, the second power connector is a 2×3 75 watt connector, and the third power connector is a 2×4 150 watt connector.

6. The computer add-in card of claim 1, wherein the processor is a central processing unit and the one or more power control signals are to be provided to the one or more multi-phase voltage regulators with one or more serial voltage identification (SVID) signals.

7. The computer add-in card of claim 1, wherein the processor is included in a baseboard management controller (BMC).

8. The computer add-in card of claim 1, further comprising a memory, wherein the one or more multi-phase voltage regulators include a first multi-phase voltage regulator to provide power to the processor and a second multi-phase voltage regulator to provide power to the memory.

9. A method comprising:
   determining a plurality of power levels of power delivered by a plurality of power connectors of a computer add-in card, including reading the plurality of power levels of the power delivered by the plurality of power connectors as measured by a plurality of power level sensors; and
   generating in response to the determined power levels of the power delivered by the plurality of power connectors, one or more power control signals for one or more multi-phase voltage regulators; and
   in response to the one or more power control signals, dynamically adjusting with one or more of the one or more multi-phase voltage regulators one or more duty cycles of one or more power phases of the power delivered by one or more of the plurality of power connectors, in order to balance power across the plurality of power connectors to allow an amount of power to be consumed by one or more components of the computer add-in card without violating respective electrical specifications for power drawn for the plurality of power connectors.

10. The method of claim 9, wherein determining the plurality of power levels further includes reading information from the one or more multi-phase voltage regulators and determining the plurality of power levels based at least in part on the information read.

11. The method of claim 9, wherein the one or more power control signals are serial voltage identification (SVID) signals.

12. The method of claim 9, further comprising providing the one or more power control signals to the one or more multi-phase voltage regulators over an inter-integrated circuit ($I^2C$) bus.

13. At least one non-transitory computer-readable medium comprising instructions stored thereon that, in response to execution of the instructions by one or more processors of a circuit card, cause the one or more processors to:
   determine a plurality of power levels of power delivered by a plurality of power connectors of the circuit card; and
   generate in response to the determined plurality of power levels of the power delivered by the plurality of power connectors, one or more power control signals for one or more multi-phase voltage regulators, to direct the one or more multi-phase voltage regulators to dynamically adjust a duty cycle of one or more power phases of the power delivered by one or more of the plurality of power connectors, in order to balance power across the plurality of power connectors to allow an amount of power to be consumed by one or more components of the circuit card without violating respective electrical specifications for power drawn for the plurality of power connectors;

wherein the one or more multi-phase voltage regulators dynamically adjust one or mores duty cycles of one or more power phases of the power delivered by one or more of the plurality of power connectors as directed.

14. The at least one non-transitory computer-readable medium of claim 13, wherein the instructions are further to cause the one or more processors to read information from the one or more multi-phase voltage regulators and determine the plurality of power levels of the power delivered based at least in part on the information read.

15. The at least one non-transitory computer-readable medium of claim 13, wherein the one or more power control signals are serial voltage identification (SVID) signals.

16. The at least one non-transitory computer-readable medium of claim 13, wherein the one or more power control signals are provided to the one or more multi-phase voltage regulators over an inter-integrated circuit ($I^2C$) bus coupling the one or more processors and the one or more multi-phase voltage regulators.

* * * * *

UNITED STATES PATENT AND TRADEMARK OFFICE
CERTIFICATE OF CORRECTION

| | | |
|---|---|---|
| PATENT NO. | : 10,903,828 B2 | Page 1 of 1 |
| APPLICATION NO. | : 15/488343 | |
| DATED | : January 26, 2021 | |
| INVENTOR(S) | : Karen Navarro Castillo et al. | |

It is certified that error appears in the above-identified patent and that said Letters Patent is hereby corrected as shown below:

In the Claims

Column 17
Line 5, "…mores…" should read "…more…"

Signed and Sealed this
Sixteenth Day of March, 2021

Drew Hirshfeld
*Performing the Functions and Duties of the
Under Secretary of Commerce for Intellectual Property and
Director of the United States Patent and Trademark Office*